(12) United States Patent
Anemikos et al.

(10) Patent No.: US 10,067,184 B2
(45) Date of Patent: Sep. 4, 2018

(54) PRODUCT PERFORMANCE TEST BINNING

(75) Inventors: Theodoros Anemikos, Milton, VT (US); Jeanne Bickford, Essex Junction, VT (US); Nazmul Habib, South Burlington, VT (US); Susan K. Lichtensteiger, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 1506 days.

(21) Appl. No.: 13/294,243

(22) Filed: Nov. 11, 2011

(65) Prior Publication Data

US 2013/0124133 A1     May 16, 2013

(51) Int. Cl.
    *G01R 27/28*   (2006.01)
    *G01R 31/00*   (2006.01)
    *G01R 31/14*   (2006.01)
    *G01R 31/317*  (2006.01)

(52) U.S. Cl.
    CPC .............................. *G01R 31/31718* (2013.01)

(58) Field of Classification Search
    CPC ................ G01R 31/31718; G01R 31/31701
    USPC ................................................. 702/117, 120
    See application file for complete search history.

(56) References Cited

U.S. PATENT DOCUMENTS

| | | | |
|---|---|---|---|
| 6,327,686 B1 | 12/2001 | Grundmann | |
| 7,327,185 B2 | 2/2008 | Mair et al. | |
| 7,475,366 B2 | 1/2009 | Kuemerle et al. | |
| 7,487,487 B1* | 2/2009 | Polson et al. | 716/113 |
| 7,640,143 B2 | 12/2009 | Bittner et al. | |
| 7,647,573 B2 | 1/2010 | Abadir et al. | |
| 7,810,054 B2 | 10/2010 | Anemikos et al. | |
| 7,856,607 B2 | 12/2010 | Grise et al. | |
| 7,877,714 B2 | 1/2011 | Anemikos et al. | |
| 7,886,247 B2 | 2/2011 | Fatemi et al. | |
| 8,249,819 B1* | 8/2012 | Treichler et al. | 702/57 |
| 8,719,763 B1* | 5/2014 | Bickford | G01R 31/31718 |
| | | | 716/113 |
| 2004/0002844 A1 | 1/2004 | Jess et al. | |
| 2004/0025123 A1 | 2/2004 | Angilivelil | |
| 2005/0107967 A1* | 5/2005 | Patel | G01R 31/3004 |
| | | | 702/64 |
| 2005/0154552 A1* | 7/2005 | Stroud et al. | 702/120 |
| 2007/0255516 A1 | 11/2007 | Patel et al. | |
| 2008/0263489 A1 | 10/2008 | Canada et al. | |
| 2009/0193373 A1 | 7/2009 | Abbaspour et al. | |
| 2010/0153896 A1* | 6/2010 | Sewall et al. | 716/6 |
| 2010/0262879 A1* | 10/2010 | Floyd et al. | 714/733 |

(Continued)

OTHER PUBLICATIONS

Iyengar et al., Variation-Aware Performance Verification Using At-Speed Structural Test and Statistical Timing, I-4244-1382—Jun. 2007 copyright 2007 IEEE, pp. 405-412.

(Continued)

*Primary Examiner* — Michael Nghiem
(74) *Attorney, Agent, or Firm* — Schmeiser, Olsen & Watts, LLP; Steve Meyers

(57) ABSTRACT

A method, test system and computer program product and system for voltage binning integrated circuit chips. The method includes selecting or changing a voltage bin of a set of voltages bins corresponding to frequency specification limits of an integrated circuit chip using functional testing of data paths of the integrated circuit chip.

22 Claims, 16 Drawing Sheets

(56) References Cited

U.S. PATENT DOCUMENTS

2011/0106497 A1* 5/2011 Visweswariah et al. ..... 702/182
2014/0024145 A1* 1/2014 Bickford ................... G06F 1/32
438/17

OTHER PUBLICATIONS

Xiong et al., Optimal Margin Computation for At-Speed Test, 978-3-9810801-3-1/DATE08 copyright 2008 EDAA, 6 pages.
Xiong et al., Pre-ATPG Path Selection for Near Optimal Post-ATPG Process Space Coverage, ICCAD'09, Nov. 2-5, 2009, San Jose, CA, USA, copyright 2009, ACM 978-1-60558-800—Jan. 9, 2011, pages 89-96.
Zolotov et al., Statistical Path Selection for At-Speed Test, 978-1-4244-2820—May 2008 copyright 2008 IEEE, pp. 624-631.
Ben et al., Estimating the Probability Density Function of Critical Path Delay via Partial Least Squares Dimension Reduction, 978-1-61284-914-0/11 copyright 2011 IEEE, 7 pages.
Bastani et al., Feature-Ranking Methodology to Diagnose Design-Silicon Timing Mismatch, 0740-7475/10 copyright 2010, IEEE Design & Test of Computers, pp. 42-52.
Boskin et al., IC Performance Prediction from Electrical Test Measurements, 0-7803-0680 copyright 1992 IEEE/SEMI Int'l Semiconductor Manufacturing Science Symposium, pp. 13-17.
Cory et al., Speed Binning with Path Delay Test in 150-nm Technology, 0740-7475/03/ copyright 2003 IEEE Design & Test of Computers, Sep.-Oct. 2003, pp. 41-45.

* cited by examiner

| PATH | BIN | | | | | | | | | | | | | | | | TESTS |
|---|---|---|---|---|---|---|---|---|---|---|---|---|---|---|---|---|---|
| | 15 | 14 | 13 | 12 | 11 | 10 | 9 | 8 | 7 | 6 | 5 | 4 | 3 | 2 | 1 | 0 | |
| 1 | F | F | F | F | F | F | F | F | F | F | F | F | P | | | | 13 |
| 2 | | | | | | | | | | | | | P | | | | 1 |
| 3 | | | | | | | | | | | | | P | | | | 1 |
| 4 | | | | | | | | | | | | | P | | | | 1 |
| 5 | | | | | | | | | | | | | P | | | | 1 |
| 6 | | | | | | | | | | | | | F | P | | | 2 |
| 7 | | | | | | | | | | | | | | F | P | | 2 |
| 8 | | | | | | | | | | | | | | | P | | 1 |
| 9 | | | | | | | | | | | | | | | P | | 1 |
| 10 | | | | | | | | | | | | | | | P | | 1 |
| 11 | | | | | | | | | | | | | | | P | | 1 |
| 12 | | | | | | | | | | | | | | | P | | 1 |
| 13 | | | | | | | | | | | | | | | P | | 1 |
| 14 | | | | | | | | | | | | | | | P | | 1 |
| 15 | | | | | | | | | | | | | | | P | | 1 |
| 16 | | | | | | | | | | | | | | | P | | 1 |

TOTAL 30

*FIG. 18A*

| PATH | BIN | | | | | | | | | | | | | | | | TESTS |
|---|---|---|---|---|---|---|---|---|---|---|---|---|---|---|---|---|---|
| | 15 | 14 | 13 | 12 | 11 | 10 | 9 | 8 | 7 | 6 | 5 | 4 | 3 | 2 | 1 | 0 | |
| 1 | F | | | | | | | F | | | | | P | | | P | 4 |
| 2 | | | | | | | | | | | | | P | | | | 1 |
| 3 | | | | | | | | | | | | | P | | | | 1 |
| 4 | | | | | | | | | | | | | P | | | | 1 |
| 5 | | | | | | | | | | | | | P | | | | 1 |
| 6 | | | | | | | | | | | | | F | P | | | 2 |
| 7 | | | | | | | | | | | | | | F | P | | 2 |
| 8 | | | | | | | | | | | | | | | P | | 1 |
| 9 | | | | | | | | | | | | | | | P | | 1 |
| 10 | | | | | | | | | | | | | | | P | | 1 |
| 11 | | | | | | | | | | | | | | | P | | 1 |
| 12 | | | | | | | | | | | | | | | P | | 1 |
| 13 | | | | | | | | | | | | | | | P | | 1 |
| 14 | | | | | | | | | | | | | | | P | | 1 |
| 15 | | | | | | | | | | | | | | | P | | 1 |
| 16 | | | | | | | | | | | | | | | P | | 1 |

TOTAL 21

*FIG. 18B*

PRODUCT PERFORMANCE TEST BINNING

FIELD OF THE INVENTION

The present invention relates to the field of integrated circuits; more specifically, it relates to methods of performance testing and binning integrated circuits.

BACKGROUND

Current methods of performance based binning of integrated circuits rely on test structures placed in various positions in the integrated circuit. This method can often misrepresent the bin because the results can often be placement dependent and not represent the actual performance of circuits in positions different from those of the test structures. The result is often power usage higher then predicted from the assigned bin or performance lower than expected from the assigned bin. Accordingly, there exists a need in the art to mitigate the deficiencies and limitations described hereinabove.

SUMMARY

A first aspect of the present invention is a method, comprising: (a) selecting a voltage bin of a set of voltage bins corresponding to a fastest frequency range specification limit of an integrated circuit chip and setting a voltage supply of the integrated circuit chip to a current supply voltage value associated with the selected voltage bin; (b) selecting a path of a set of testable data paths of the integrated circuit chip; (c) performing a functional path test on the selected path, the functional path test based on applying test patterns to the selected path at the current supply voltage value; (d) if the integrated circuit chip fails the functional path test, then changing the current supply voltage value to a voltage value associated with a not previously selected voltage bin, selecting a not previously tested path of the set of testable paths, and repeating (c) and (d) until all paths of the set of testable paths have been tested; and (e) setting a path voltage bin for the integrated circuit chip to a voltage bin of the set of voltage bins corresponding to the current supply voltage value.

A second aspect of the present invention is a test system including a tester connected to a computer system comprising a processor, a memory coupled to the processor, and a computer readable storage device coupled to the processor, the storage device containing program code configured to be executed by the processor via the memory to implement a method for voltage binning electronic devices, the method comprising: (a) selecting a voltage bin of a set of voltage bins corresponding to a fastest frequency range specification limit of an integrated circuit chip and setting a voltage supply of the integrated circuit chip to a current supply voltage value associated with the selected voltage bin; (b) selecting a path of a set of testable data paths of the integrated circuit chip; (c) performing a functional path test on the selected path, the functional path test based on applying test patterns to the selected path at the current supply voltage value; (d) if the integrated circuit chip fails the functional path test, then changing the current supply voltage value to a voltage value associated with a not previously selected voltage bin, selecting a not previously tested path of the set of testable paths, and repeating (c) and (d) until all paths of the set of testable paths have been tested; and (e) setting a path voltage bin for the integrated circuit chip to a voltage bin of the set of voltage bins corresponding to the current supply voltage value.

A third aspect of the present invention is a computer program product for voltage binning electronic devices, the computer program product comprising: a computer readable storage device having computer readable program code embodied therewith, the computer readable program code comprising: computer readable program code configured to perform a method comprising: (a) selecting a voltage bin of a set of voltage bins corresponding to a fastest frequency range specification limit of an integrated circuit chip and setting a voltage supply of the integrated circuit chip to a current supply voltage value associated with the selected voltage bin; (b) selecting a path of a set of testable data paths of the integrated circuit chip; (c) performing a functional path test on the selected path, the functional path test based on applying test patterns to the selected path at the current supply voltage value; (d) if the integrated circuit chip fails the functional path test, then changing the current supply voltage value to a voltage value associated with a not previously selected voltage bin, selecting a not previously tested path of the set of testable paths, and repeating (c) and (d) until all paths of the set of testable paths have been tested; and (e) setting a path voltage bin for the integrated circuit chip to a voltage bin of the set of voltage bins corresponding to the current supply voltage value.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 18A is a chart illustrating bin validation using a sequential bin selection methodology according to embodiments of the present invention;

FIG. 18B is a chart illustrating bin validation using a binary bin selection methodology according to embodiments of the present invention;

DETAILED DESCRIPTION

The embodiments of the present invention provide methods of voltage binning using functional path testing or a combination of performance sort ring oscillator (PSRO) testing and functional path testing. An example of functional path testing is performance path testing which is an efficient way of performing functional testing of logic circuits. A second example of functional path testing is the use of functional patterns that exercise the circuit functions.

The term critical path is defined as a data path between an input point and an output point where the time delay of the data signal being presented at the input point and received at the output point must be between upper and lower performance specifications or the integrated circuit will be rejected. Not all data paths are critical paths. In one example, the input and output points of data paths are latches. In one example, the input and output points of data paths are latches of Level Sensitive Scan Design (LSSD) scan chains.

Figure 1:
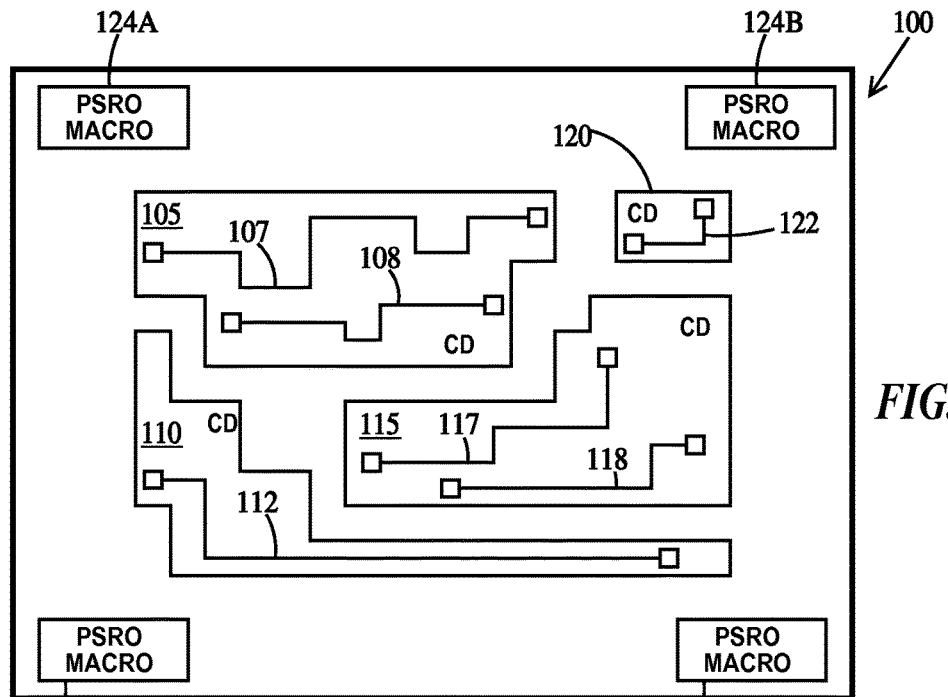
FIG. 1 illustrates clock domains, data paths and performance test structures of an exemplary integrated circuit chip.

FIG. 1 illustrates clock domains, data paths and performance test structures of an exemplary integrated circuit chip. In FIG. 1, an integrated circuit chip 100 includes a clock domain (CD) 105 having critical paths 107 and 108, a clock domain 110 having a critical path 112, a clock domain 115 having critical paths 117 and 118 and a clock domain 120 having a critical path 122. A clock domain is logical region of an integrated circuit chip where the elements (e.g., latches, logic gates, etc.) of all critical paths are clocked with the same clock signal. The clock signals of different clock domains may differ from each other in, for example, having different periods, different frequencies, being independently powered (some clock domains may be turned off while others remain powered) and are not necessarily synchronous to each other. While four clock domains are illustrated in FIG. 1, there may be more or less than four clock domains. The number of critical paths within any given clock domain may be more than tens of thousands.

Also illustrated in FIG. 1 are four performance sort ring oscillator (PSRO) macros 124A, 124B, 124C and 124D. A macro is a predesigned circuit that may be added to an integrated circuit design in one or more locations. In the present example, PSRO macros 124A, 124B, 124C and 124D are added proximate to the corners of the integrated circuit. However, PSRO macros may be placed in any region of the integrated circuit chip. The contents of PSRO macros 124A, 124B, 124C and 124D are illustrated in FIG. 11B and described infra.

Figure 2:
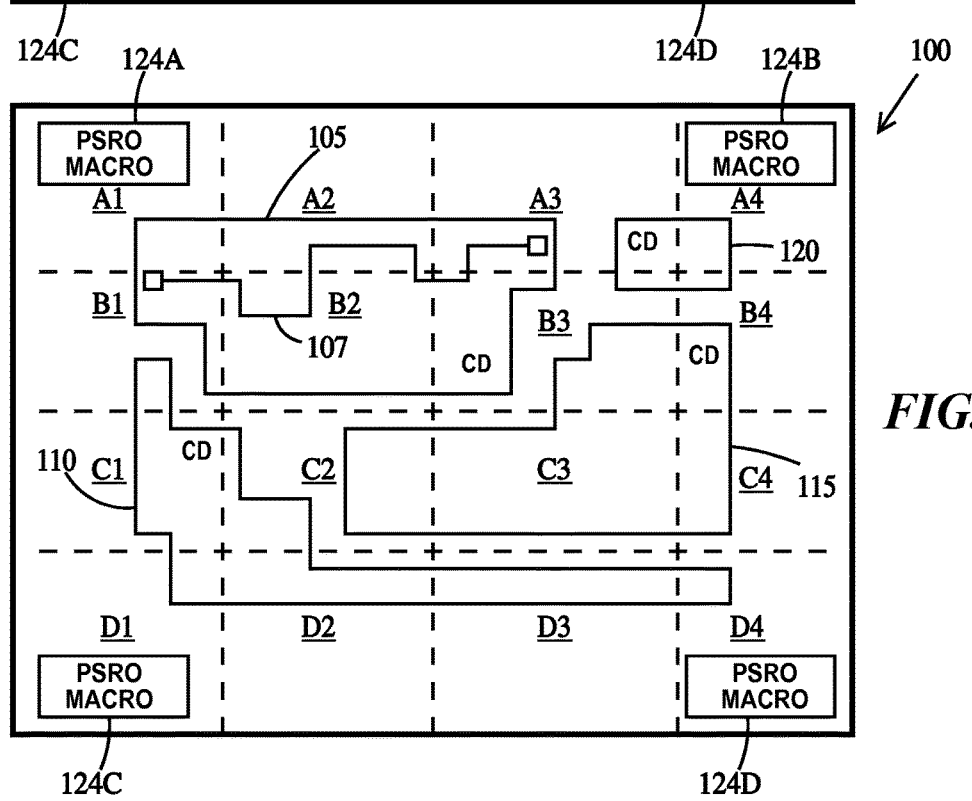
FIG. 2 illustrates the exemplary integrated circuit chip of FIG. 1 partitioned into regions used to generate performance paths used by embodiments of the present invention.

FIG. 2 illustrates the exemplary integrated circuit chip of FIG. 1 partitioned into regions used to generate performance paths used by embodiments of the present invention. In FIG. 2, integrated circuit 100 has been partitioned into sixteen contiguous regions A1, A2, A3, A4, B1, B2, B3, B4, C1, C2, C3, C4, D1, D2, D3, and D4. Some regions include portions of only one clock domain (e.g., clock region A1 includes only a portion of clock region 105) and some clock regions may include portions of multiple clock regions (e.g., region B1 includes a portion of clock domain 105 and 110). Some regions may include no clock domains. While critical paths 108, 112, 117, 118 and 122 of FIG. 1 are not illustrated in FIG. 2 for clarity, critical path 107 has been illustrated to show that any given critical paths may cross region boundaries. For example, critical path 107 starts in region B1, passes through region B2, then through A2, back again into region B2, then through region B3 and ends in region A3.

Figure 3:
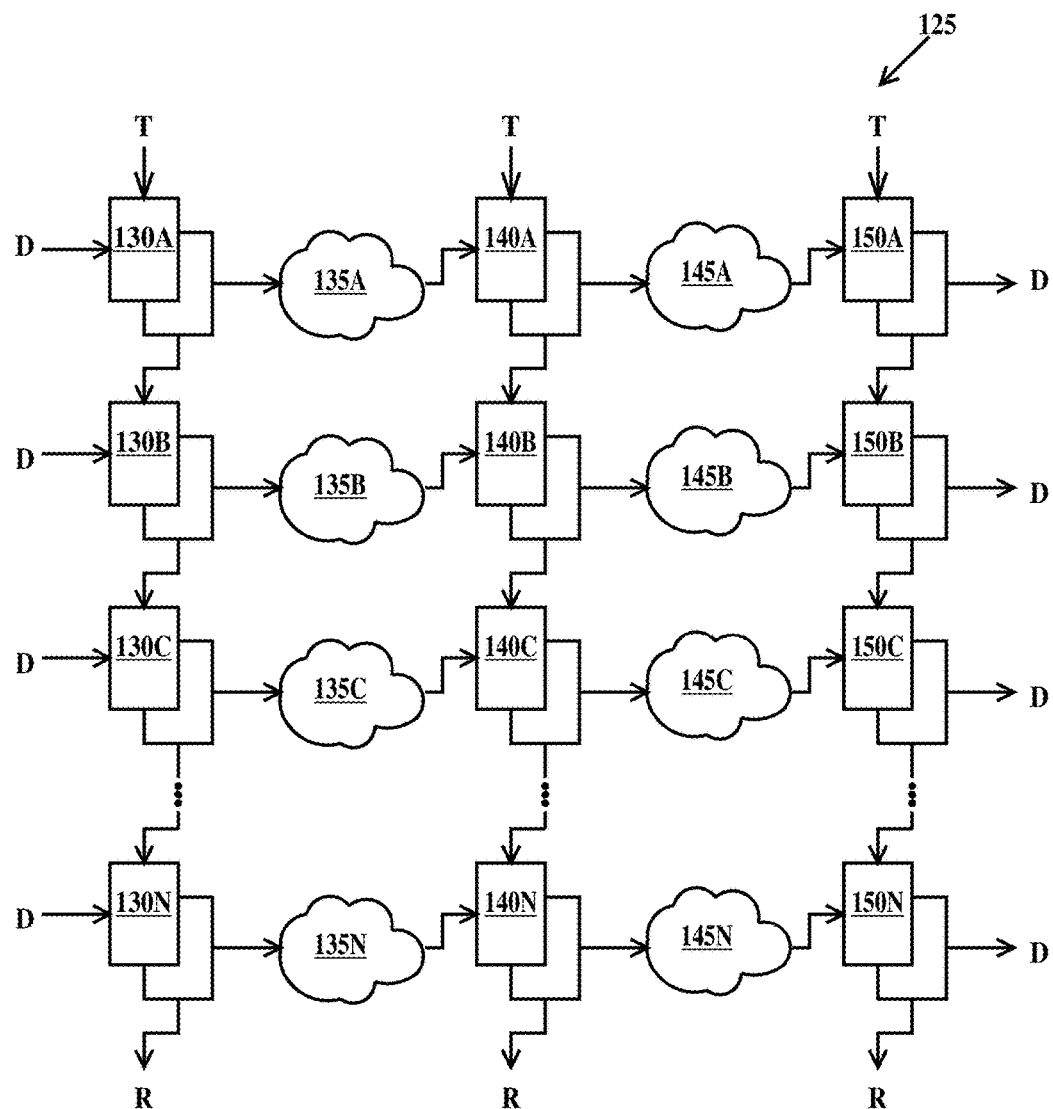
FIG. 3 is an exemplary schematic diagram of a scan latch circuit used in testing logic circuits of integrated circuits.

FIG. 3 is an exemplary schematic diagram of a scan latch circuit used in testing logic circuits of integrated circuits. In FIG. 3, and LSSD scan chain 125 includes a first set of latches 130A through 130N, a second set of latches 140A through 140N and a third set of latches 150A through 150N. Each latch has a first input for operational data, a second input for test data, a first output for operational data and a second output for resultant test data. Data is clocked through logic gates in clouds of logic 135A through 135N from respective latches 130A through 130N to respective latches 140A through 140N by a data clock, usually designated the "A" clock. Data is clocked through logic gates in clouds of logic 145A through 145N from respective latches 140A through 140N to respective latches 150A through 150N by the same data clock. Test data is clocked through latches 130A through 130N, latches 140A through 140N and through latches 150A through 150N, by a first test clock, usually designated clock "C." Test data is clocked through logic circuits 135A to 145A through logic circuits 135N to 145N by a second test clock, usually designated clock "B." Clock "A" is the domain clock. A critical path starts and stops with a scan latch and includes a data path within the logic gates of the logic cloud connected by the two scan latch, for example latch 130A, logic cloud 135A and latch 140A.

Figure 4:
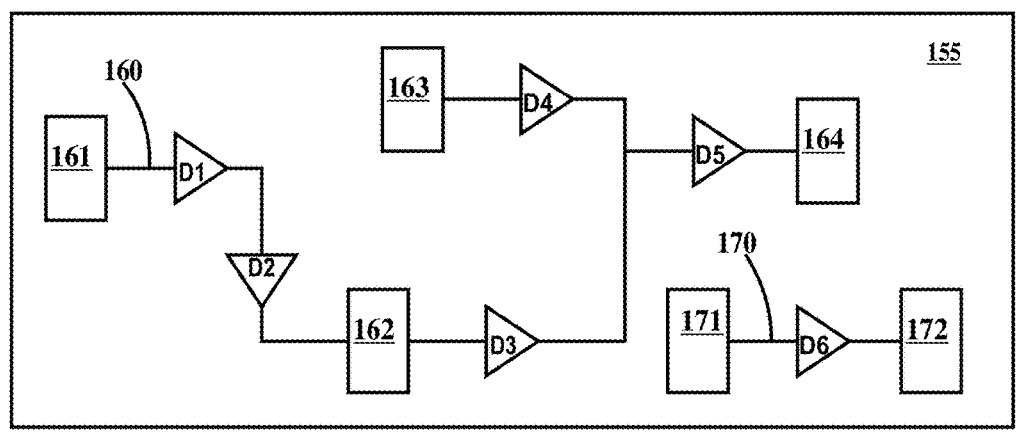
FIG. 4 is a schematic diagram illustrating two critical paths belonging to different clock domains in a same region of an integrated circuit chip.

FIG. 4 is a schematic diagram illustrating two critical paths belonging to different clock domains in a same region of an integrated circuit chip. In region 155, a logic circuit 160 of a first clock domain comprises latches 161, 162, 163 and 164 and delays D1, D2, D3, D4 and D5. The delays represent the timing delay through combination logic (sequences of logic gates). There are three possible critical paths for logic circuit 160. The first is latch 163, delay D4, delay D5, and latch 164. The second is latch 162, delay D3, delay D5, and latch 164. Region 155 also includes a logic circuit 170 of a second clock domain and comprising latches 171 and 172 and delay D6. Logic circuit 160 presents a problem in that it is desirable to select the most critical path out of the three possible critical paths (assuming only one critical path is selected for the clock domain). This is resolved by an algorithm called "branch-and-bound." See U.S. Pat. No. 7,886,247 issued Feb. 8, 2011 which is hereby incorporated by reference.

Figure 5:
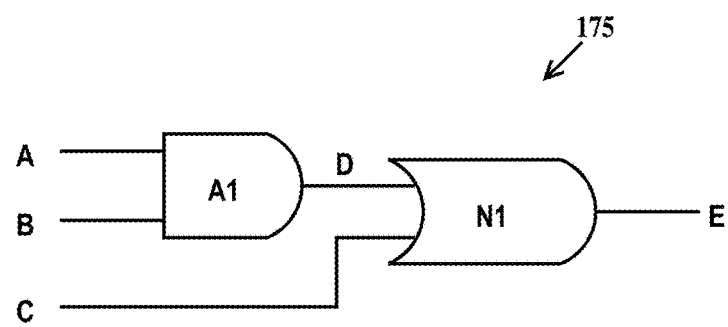
FIG. 5 is an exemplary schematic diagram of a simple logic circuit illustrating the principle of path sensitization.

FIG. 5 is an exemplary schematic diagram of a simple logic circuit illustrating the principle of path sensitization. In FIG. 5, a logic circuit 175 comprises an AND gate A1 having a first input A and a second input B, and output D which is also a first input of a NAND gate N1, having a second input C and an output E. To robustly test the path A to E, C must be kept a zero if a fault on A is to be detected independent of the value on B. The test pattern generated for testing the path A to E must include placing a zero on C while A transitions from zero to one and from one to zero. The same is true for robustly testing the path B to E. Application of path sensitization ensures that only robust tests are created for a given critical path, with no glitches, false fails or false accepts (test escapes)

Figure 6:
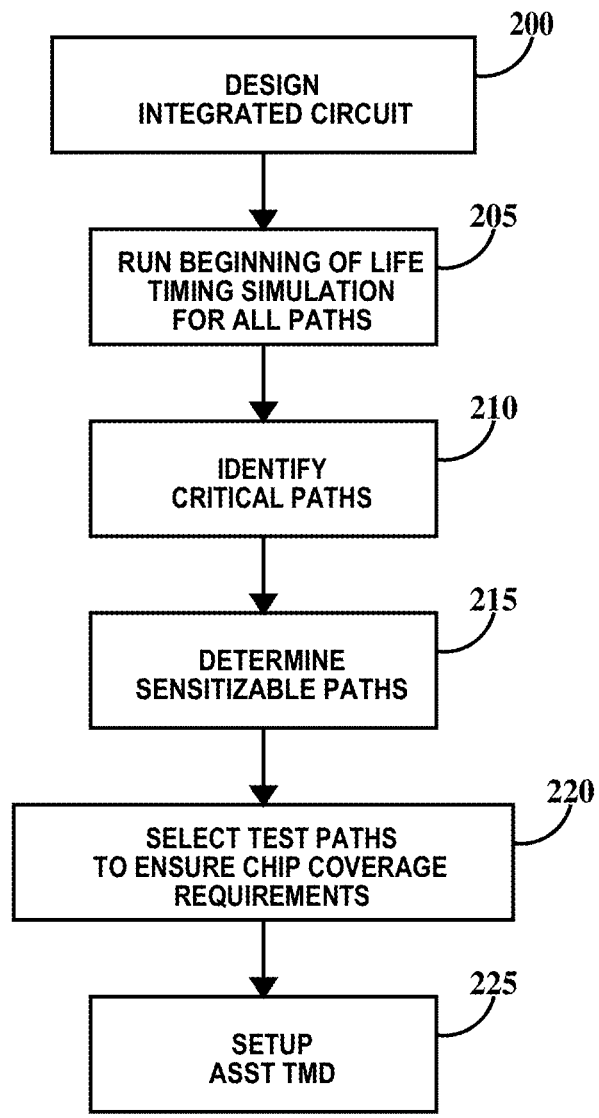
FIG. 6 is a flow diagram of the concept of generating a performance path test used by embodiments of present invention.

FIG. 6 is a flow diagram of the concept of generating a performance path test used by embodiments of present invention. In step 200, an integrated circuit is designed. In step 205, a beginning of life static statistical timing analysis for the integrated circuit chip is performed where all timing information is represented as a canonical form, i.e., the timing Di is represented as a function of nominal process delay DNi and process parameter induced delay SPi as $Di=DNi+\Sigma^P (SPi)$. In step 210, the critical paths are identified by the "branch and bound" algorithm discussed supra. In step 215, the testable paths are identified. Testable paths are defined as the subset of critical paths that are can be tested using test patterns. Testable paths are generated, for example, using an Automatic Test Pattern Generator (ATPG) check program. In step 220, a subset of the testable paths (i.e., test paths) is selected to ensure adequate integrated circuit chip test coverage. The test paths should provide test coverage for delay limits (e.g., $2\sigma$, $3\sigma$, etc.) for the following process parameters: across chip variations (e.g., high and low density of polysilicon lines, high and low density of substrate isolation, density of wiring, etc.) and wiring levels (e.g., which wiring levels are used and the length of wire on each level). A general methodology for selecting the subset of testable parts is described infra with respect to FIGS. 7 and 8. More specific embodiments are described infra with respect to FIGS. 9 and 10. In step 225, a test program is generated, for example, a performance path testing At Speed Structural Test (ASST) including Test Manufacturing Data (TMD) is generated. The TMD contains the information required to setup a tester to perform performance path testing ASST testing according to embodiments of the present invention.

Figure 7:
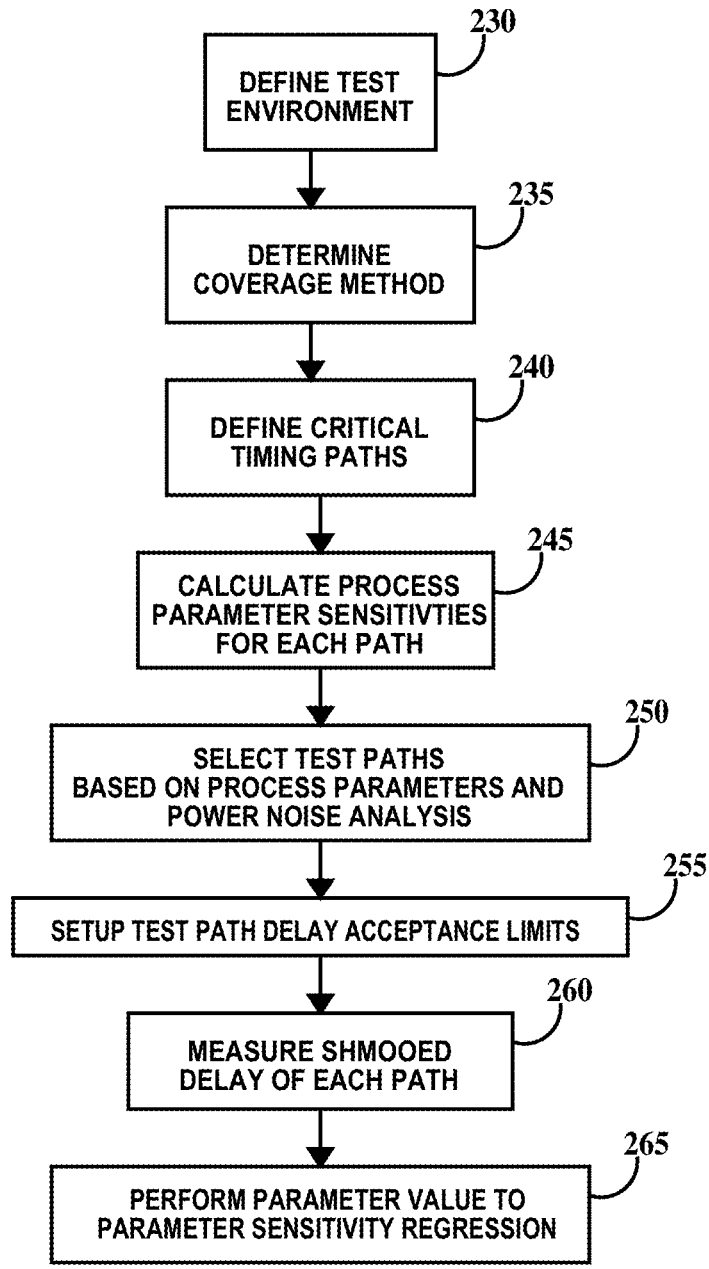
FIG. 7 is a flow diagram of a general method of generating a performance path test used by embodiments of present invention.

FIG. 7 is a flow diagram of a general method of generating a performance path test used by embodiments of present invention. In step 230, the test environment is defined. This includes running an across-chip AC power noise simulation which includes power-up-power-down cycling to select a power level range having minimum or no signal-to power coupling noise to perform a static timing simulation. Then the static statistical timing is performed with the selected power range, a test temperature, and the beginning of life process parameters. In step 235, the test coverage method for performance path testing (see FIGS. 9 and 10 and discussion infra) is selected. In step 240, critical paths by clock domain are selected. In step 245, for each critical path, timing delay sensitivities to process parameter are calculated. In step 250, a subset of the critical paths (i.e., test paths) is selected. The selection criteria includes: selecting critical paths with a range of different process parameters. In step 255, test path delay limits acceptance limits are setup. These include worst case (WC) (e.g., late data arrival and early clock at the input point of the path) and best case (BC) (e.g., early data arrival and late clock at the input point of the path). In step 260, the frequency shmooed delay of each path of a subset of the critical paths is run on a sample of integrated circuit chips using a tester. The results are evaluated in step 280 of FIG. 8 discussed infra.

Figure 8:
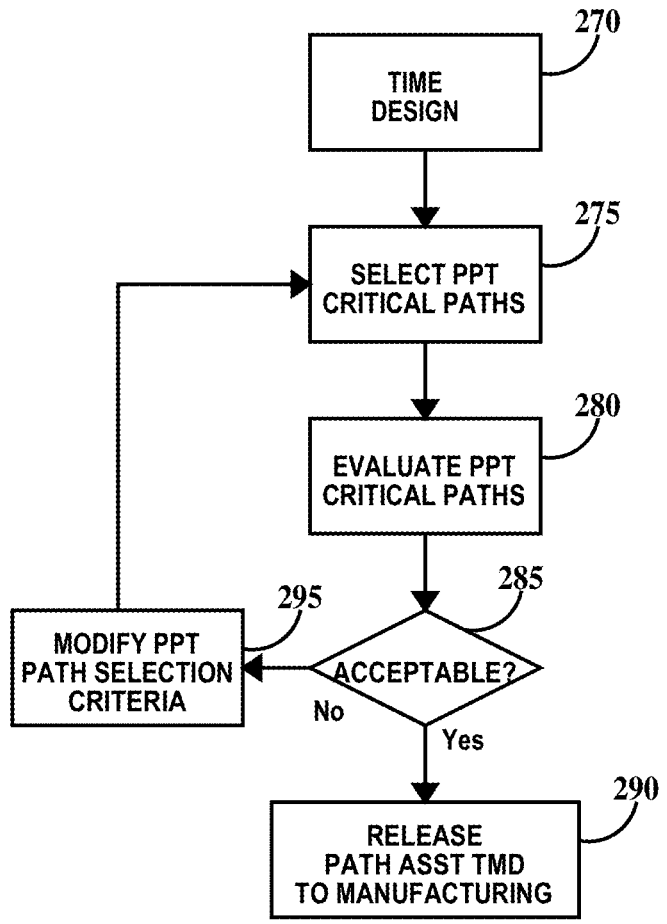
FIG. 8 is a flow diagram of a method of verifying test paths used for performance path testing used by embodiments of present invention.

FIG. 8 is a flow diagram of a method of verifying test paths used for performance path testing used by embodiments of present invention. In step 270, the integrated circuit design is timed as described supra. In step 275, the test paths are selected as described supra. In step 280, the test paths are evaluated by testing a sample of physical integrated circuit chips as illustrated in steps 255, 260 and 265 of FIG. 7 and described supra. In step 285, it is determined (for example, from the regression analysis) if the Path ASST TMD results are acceptable. If the results are acceptable, then in step 290, the Path ASST TMD is released to manufacturing test. If the results are not acceptable, then in step 295, the test paths selection "rules" are modified and the method loops back to step 275.

Figure 9:
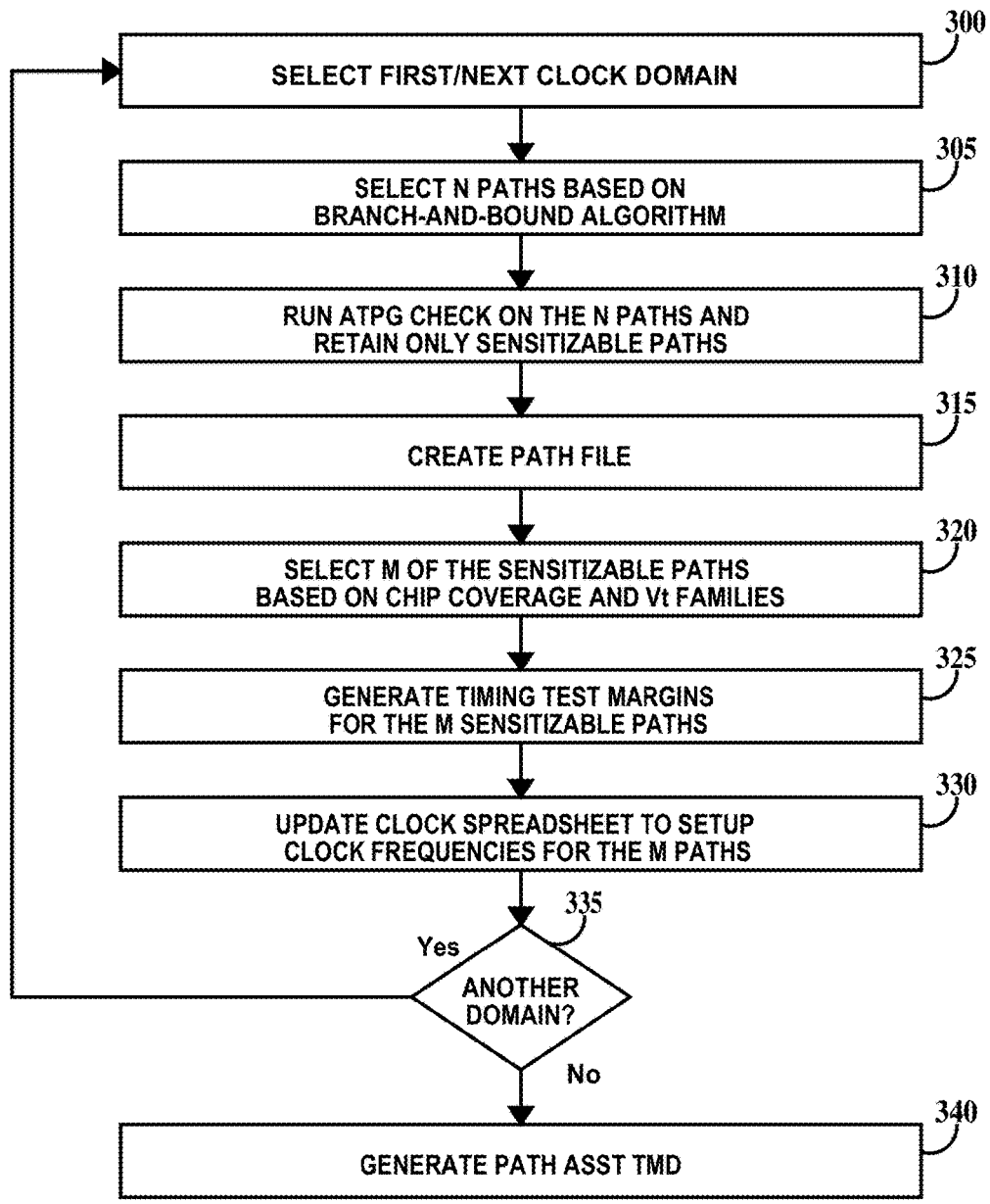
FIG. 9 is a flow diagram of a first method of selecting test paths for performance path testing used by embodiments of present invention.

FIG. 9 is a flow diagram of a first method of selecting test path for performance path testing used by embodiments of present invention. In step 300, the first/next clock domain of the integrated circuit is selected. In step 305, N critical paths are selected based on a branch-and-bound algorithm. N is an integer greater than 1. In one example, N is at least about 1000. In step 310, an ATPG check is run on the N paths and only the testable (e.g., testable) paths are retained. In step 315, a path file is created. The path file includes such information as physical path location, designed path timing delay, designed slack (slack is the difference between required arrival time of data at a latch and the actual time the data arrives), and designed upper and lower timing bounds (e.g., WC and BC) for each path. In step 320, M of the testable paths are selected to include paths from different regions of the chip and to include a variety of paths of high sensitivities to different Vt (threshold voltage) families because the designed delay in a path is a function of the designed Vt of the transistors of the circuit path. M is an integer greater than 1. In one example, step 320 is performed manually. In one example, step 320 is performed automatically and then adjusted manually. In step 325, timing test margins (frequency and/or voltage) for the M testable paths are generated based on path timing information. In step 330, the clock spreadsheet generated during design of the integrated circuit is updated to reflect the test clock frequency to be used for each of the M paths based on the test margins of step 330. In one example, step 330 is performed automatically. In one example, step 330 is performed manually. In one example, step 330 is performed automatically and then adjusted manually. In step 335, it is determined if there is another clock domain to process. If so, the method loops back to step 300, otherwise the method proceeds to step 340.

In step 340, a path ASST TMD is generated using, for example, an ATPG tool. Note M and N may vary from clock domain to clock domain.

Figure 10:
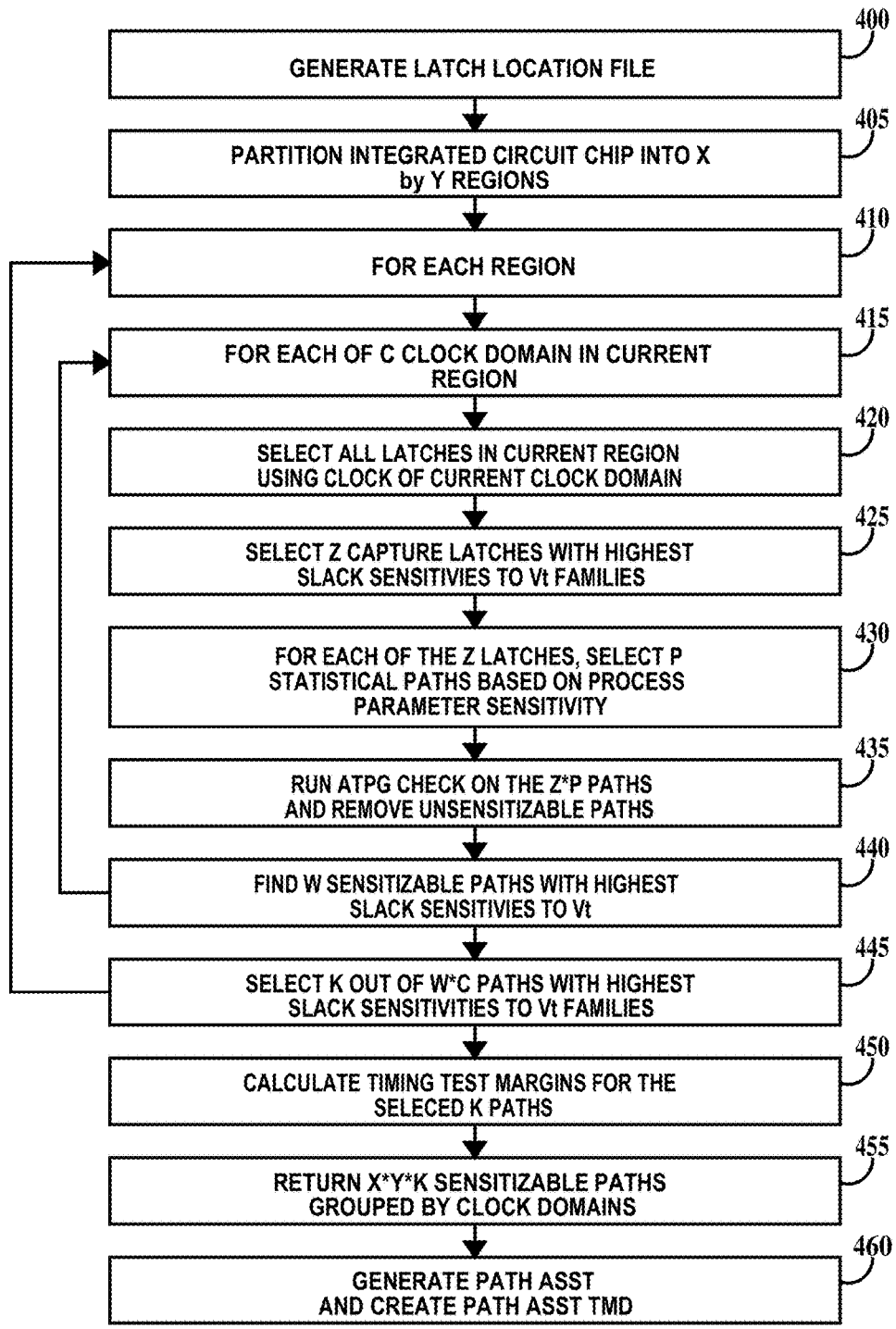
FIG. 10 is a flow diagram of a second method of selecting test paths for performance path testing used by embodiments of present invention.

FIG. 10 is a flow diagram of a second method of selecting test paths for performance path testing used by embodiments of present invention. In step 400, a latch location file is generated. The latch location file includes the location on the integrated circuit of all scan latches (e.g., LSSD latches) in the integrated circuit design. In step 405, the integrated circuit design is partitioned into X by Y (=R) regions. See for example, FIG. 2 where X=Y=4 and integrated circuit 100 has been partitioned into 16 regions. In step 410, a loop of steps by region is started. In step 415, a sub-loop of steps by clock domain is started which is performed for all clock domains in the current region. There are C clock domains in each region, but C may vary from region to region. X is an integer greater than 1. Y is an integer greater than 1. C is an integer greater than 1.

Starting the clock domain sub-loop, in step 420, all latches in the Current region and using the clock of the current clock domain are selected. In step 425, Z latches having the highest slack sensitivities to Vt families are selected. In order to break "ties" slack sensitivities to wiring parameters (e.g., length of wires by wiring level), test margins (e.g., voltage, frequency), may be used. Z is an integer greater than 1. In one example, Z=200. In step 430, for each of the Z latches, P paths are selected based on process parameter sensitivities (e.g., across chip variations, high and low density of polysilicon lines, high and low density of substrate isolation, density of wiring, etc.) and wiring levels (e.g., which wiring levels are used and the length of wire on each level). P is an integer greater than 1. In one example, P=5. In step 435, an ATPG check is run on the Z*P (in the examples, 200*5=1000). In step 435, an ATPG check is run on the Z*P paths to remove untestable paths. In step 440, W testable paths having the highest slack sensitivities to Vt families are selected. In order to break "ties" slack sensitivities to wiring parameters (e.g., length of wires by wiring level), test margins (e.g., voltage, frequency), may be used. In one example, W=2. Steps 420 through 440 are repeated for each clock domain in the current region.

Continuing the region loop, in step 445, K of the W*C testable paths having the highest slack sensitivities to Vt families are selected. In order to break "ties" slack sensitivities to wiring parameters (e.g., length of wires by wiring level), test margins (e.g., voltage, frequency), may be used. In one example, K=2. In step 450, the test timing margins (voltage, frequency) are calculated for the K paths. Steps 410, 445 and 450 are repeated for each region.

In step 455, there will be X*Y*K testable paths grouped by clock domains. In the example of X=4, Y=4 and K=2, there will be 32 paths. In step 460, a path ASST TMD is generated for performance path testing the X*Y*K testable paths using, for example, an ATPG tool. Note M and N may vary from clock domain to clock domain.

Figure 11A:
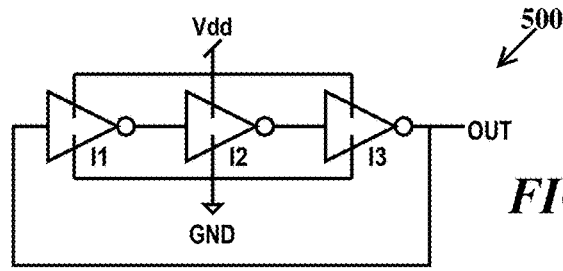
FIG. 11A is a schematic diagram of an exemplary ring oscillator.
Figure 11B:
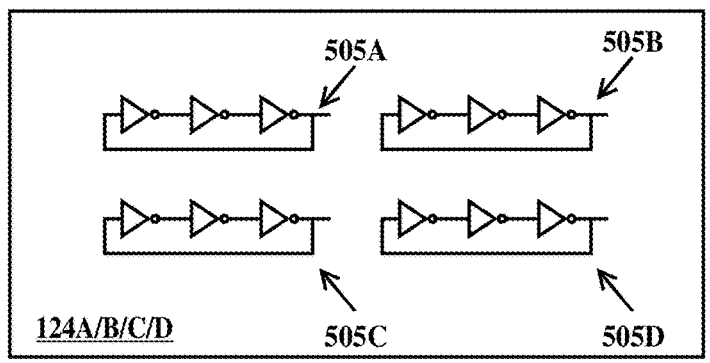
FIG. 11B is a schematic diagram of an exemplary performance sort ring oscillator macro.

FIG. 11A is a schematic diagram of an exemplary ring oscillator. In FIG. 11A, a ring oscillator comprises three inverters I1, I2 and I3 connected in series. The output of inverter I1 connected to the input of inverter I2, the output of inverter I2 connected to the input of inverter I3, the output of inverter I3 connected to the input of inverter I1. The output of inverter I3 is also the output of ring oscillator 500. While three inverters are illustrated, there may be as a few as three or more than three but odd number of inverters in ring oscillators used in the PSRO macros of embodiments of the present invention.

FIG. 11B is a schematic diagram of an exemplary performance sort ring oscillator macro. In FIG. 11B, each of macros 124A, 124B, 124C and 124D (see FIG. 1) include four ring oscillators 505A, 505B, 505C and 505D. Each of ring oscillators 505A, 505B, 505C and 505D is fabricated from transistors belonging to a different and only one threshold voltage (Vt) family. For example, the devices of ring oscillator 505A belong to Vt family 1 and are the fastest and have the most leakage, the devices of ring oscillator 505B belong to Vt family 2 and are the second fastest and have the second most leakage, the devices of ring oscillator 505C belong to Vt family 3 and are the third fastest and have the third most leakage and the devices of ring oscillator 505D belong to Vt family 4 and are the slowest and have the least leakage. In one example, leakage can be caused by physical differences in the thickness of the gate dielectric between devices of different Vt families. The smaller Tox, the lower the Vt and the faster and more leaky the device. In another example, leakage can be caused by Vt skew. PSRO macro testing may be used to disposition integrated circuits based on the frequency output of the ring oscillators which may be converted to a PSRO delay value. While four ring oscillators are illustrated, there may be as few as one or more than four, so "four" should be considered exemplary.

Figure 12A:
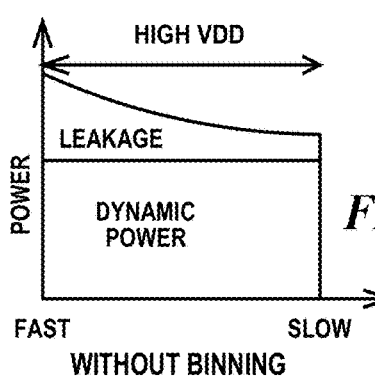
FIG. 12A is a plot of power consumption vs. performance without voltage binning.

FIG. 12A is a plot of power consumption vs. performance without voltage binning. There are two components to circuit power consumption, leakage current and dynamic power consumption. Dynamic power consumption is a function of the supply voltage to a circuit. Leakage current of a circuit is greater for faster circuits than slower circuits at a given circuit power supply voltage level (VDD). Fast FETs consume more power and, when the FETs are faster than required, are wasteful of power.

Figure 12B:
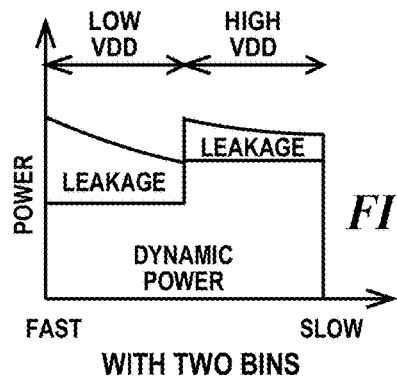
FIG. 12B is a plot of power consumption vs. performance with two bin voltage binning.

FIG. 12B is a plot of power consumption vs. performance with two bin voltage binning. Dynamic power can be reduced by running faster circuits at lower VDD than the slower circuits. The leakage current reduces very slightly with decreasing VDD.

Voltage binning assumes a fixed relationship between performance and leakage current. If the assumed relationship is incorrect, then the wrong bin can be assigned to an integrated circuit chip. For example, if the leakage of an integrated circuit is assumed to be in the low VDD domain but is actually in the high VDD domain then the circuit will be slow and the performance specification of the circuit may not be met. In another example, if the leakage of an integrated circuit is assumed to be in the high VDD domain but is actually in the low VDD domain the circuit will draw more power than expected and the performance specification for the circuit may not be met. This is false voltage binning. One way the performance/leakage relationship can be incorrect is because ring oscillators, having fewer FETs, will not represent the actual leakage of the number of FETs in the circuit paths. The embodiments of the present invention either check (validate) and correct voltage bin assignment by actual measurement of the circuit paths or assign voltages bins by actual measurement of the circuit paths. The actual voltage bins are assigned using ring oscillator simulations and optionally confirmed by ring oscillator measurements on actual integrated circuit chips.

Figure 12C:
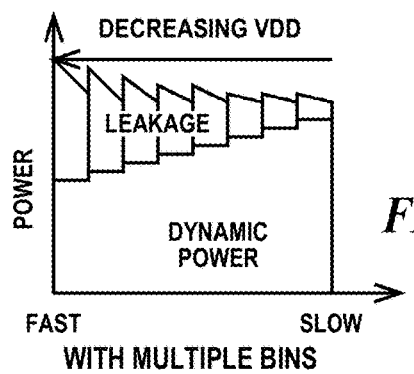
FIG. 12C is a plot of power consumption vs. performance with multiple bin voltage binning.

FIG. 12C is a plot of power consumption vs. performance with multiple bin voltage binning. Multiple binning is still subject to the same problem of false voltage binning though the level of the problem is reduced because the difference between the expected and actual leakages are reduced by the use of more VDD levels. However, even at this reduced false binning error rate the percentage of "escapes" may still be too high.

Figure 13:
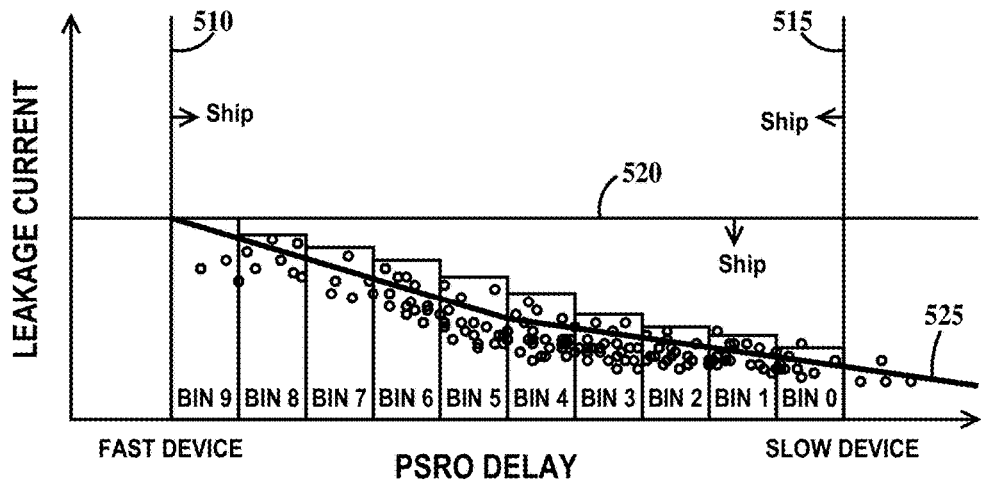
FIG. 13 illustrates binning of product having an acceptable power to performance ratio.

FIG. 13 illustrates binning of product having the assumed relationship between performance and leakage current. In FIG. 13, lines 510 and 515 represent distribution limits of PSRO delay. Line 510 represents the upper specification limit for the fastest devices (e.g., FETs) allowed and line 515 represents the lower specification limit for the slowest devices (e.g., FETs) allowed. Line 520 represents the maximum device (e.g., FETs) leakage current limit (the lower limit is zero). Curve 525 is a curve fit of current leakage versus PSRO delay for a multiplicity of individual chips (each chip is represented by a circle). In the example of FIG. 13, 10 voltage bins are overlaid on curve 525 and there are very few escapes. There is an escape in Bin 0 and another in Bin 1. It is clear that if the distribution of circles moved toward higher leakage, there would be very more escapes.

Figure 14:
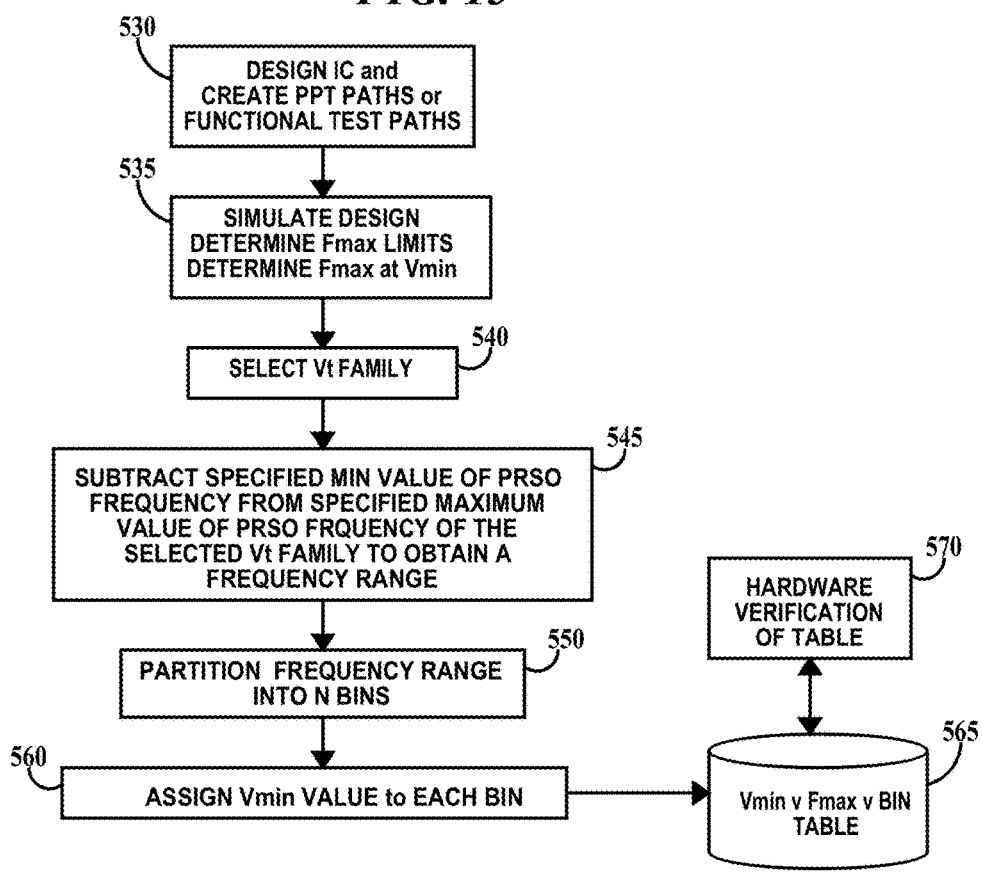
FIG. 14 is a flowchart illustrating generation of voltage bins according to embodiments of the present invention.

FIG. 14 is a flowchart illustrating generation of voltage bins according to embodiments of the present invention. In step 530 an integrated circuit is designed and either performance path testing paths and/or other functional test paths are created. In step 535, timing simulations at T0 (the integrated circuit has not previously been turned on) are performed on the design and expected upper and lower frequency limits of the integrated circuit determined as well as the relationship between frequency (Fmax) and supply voltage (Vmin) values.

In step 540, a Vt family (K) is selected (e.g., those of ring oscillators 505A of FIG. 11B). In step 545, the minimum allowed value of PSRO frequency (F1) (e.g., the slow device limit of FIG. 13) is subtracted from the highest allowed value of PSRO frequency (F2) (e.g., the fast device limit of FIG. 13) to obtain a frequency range. This is done based on ring oscillator simulations and may optionally be verified by hardware testing. Next, in step 550, the frequency range is partitioned into bins by dividing the frequency range by the number of bins minus 2 to obtain a bin size B. The first BIN starts at F2 and each subsequent bin is incremented B from the previous bin until the last bin ends at F1. Next in step 560, a VDD value Vmin is assigned to each bin based on the simulation results of step 535 VDD15 is greater VDD14 which is greater than VDD13 continuing through VDD1 which is greater than VDD0. Table I gives an example of a BIN by Fmax by Vmin table where X is the value of Fmax. BIN 15 is the fastest circuit bin and has the lowest power supply voltage. BIN 0 is the slowest circuit bin and has the highest power supply voltage. There is a separate table for each Vt family. In the example of FIG. 11B there would be four voltage families.

TABLE I

FOR Vt FAMILY K

| BIN | Fmax Range | Vmin |
|---|---|---|
| 15 | X[F2 | VDD15 |
| 14 | F2[X[(F2 + B) | VDD14 |
| 13 | (F2 + B)[X[(F2 + 2B) | VDD13 |
| 12 | (F2 + 2B)[X[(F2 + 3B) | VDD12 |
| 11 | (F2 + 3B)[X[(F2 + 4B) | VDD11 |
| 10 | (F2 + 4B)[X[(F2 + 5B) | VDD10 |
| 9 | (F2 + 5B[X[(F2 + 6B) | VDD9 |
| 8 | (F2 + 6B)[X[(F2 + 7B) | VDD8 |
| 7 | (F2 + 7B)[X[(F2 + 8B) | VDD7 |
| 6 | (F2 + 8B)[X[(F2 + 9B) | VDD6 |
| 5 | (F2 + 9B)[X[(F2 + 10B) | VDD5 |
| 4 | (F2 + 10B)[X[(F2 + 11B) | VDD4 |

TABLE I-continued

FOR Vt FAMILY K

| BIN | Fmax Range | Vmin |
|---|---|---|
| 3 | (F2 + 11B)[X[(F2 + 12B) | VDD3 |
| 2 | (F2 + 12B)[X[(F2 + 13B) | VDD2 |
| 1 | (F2 + 13B)[X[(F2 + 14B) | VDD1 |
| 0 | F1[X | VDD0 |

Step 560 generates Vmn/Fmax/Bin table 565. Table 565 may be verified (and corrected if necessary) by measurements on physical integrated circuit chips (i.e., hardware).

Figure 15:
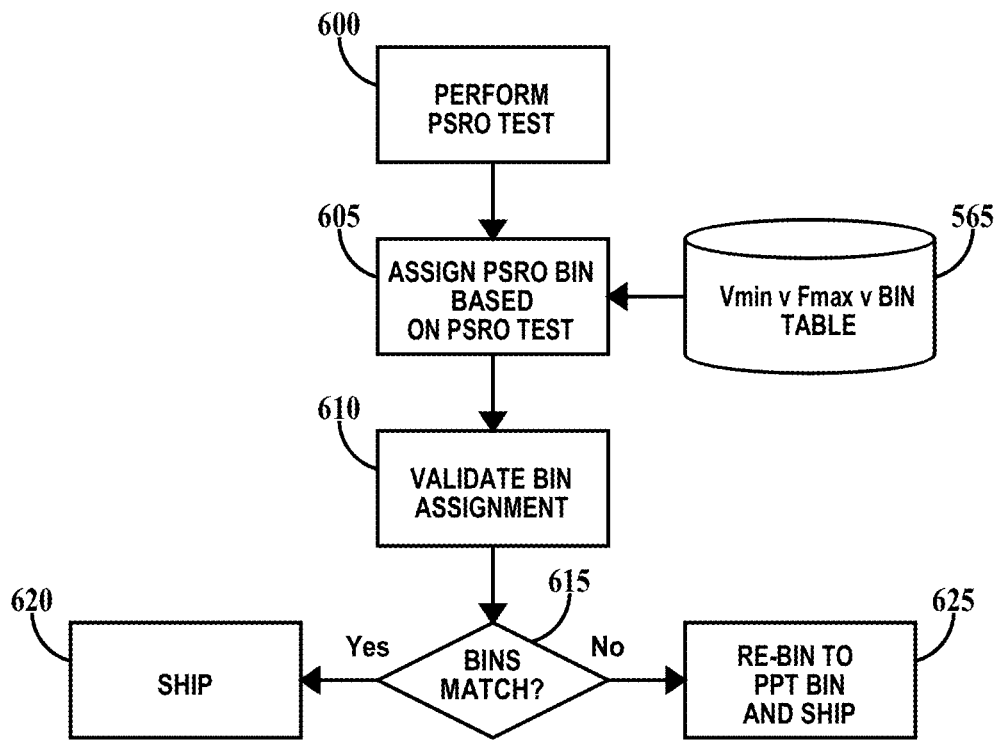
FIG. 15 is a flowchart illustrating a method of validating assigned voltage bins and if necessary, re-assigning voltage bins according to embodiments of the present invention.
Figure 16:
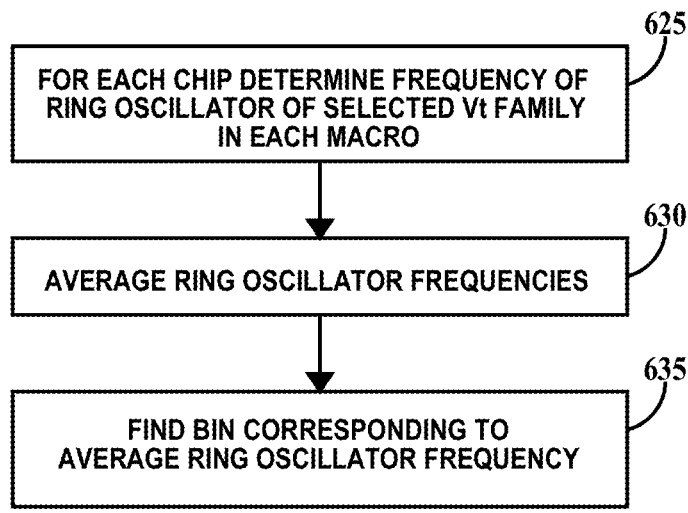
FIG. 16 is a flowchart illustrating voltage bin assignment according to embodiments of the present invention.

FIG. 15 is a flowchart illustrating a method of validating assigned voltage bins and if necessary, re-assigning voltage bins according to embodiments of the present invention. In step 600, PSRO testing is performed using the same voltage that the PSRO simulation used in FIG. 14. In step 605, a PSRO voltage bin is selected from table 565 using the results of the PRSO testing of step 600. An example of steps 600 and 605 is illustrated in FIG. 16 and described infra. In step 610, the assigned voltage bin is validated. Step 610 is illustrated in more detail in FIG. 17 and described infra. Step 610 produces a path voltage bin. If, in step 615, the path voltage pin matches the PSRO voltage bin, the method proceeds to step 620 where the integrated circuit chip is approved to ship or stock. If, in step 615, the path voltage pin does not match the PSRO voltage bin, the method proceeds to step 625. In step 625, the integrated circuit chip is re-binned using the path voltage bin and the integrated circuit chip is approved to ship or stock. The speed sort voltage bin of the integrated circuit chip is the path voltage bin. It is preferred that the PSRO voltage bin assignment is performed at wafer level testing and the path voltage bin assignment is performed at module testing. However, both PSRO voltage bin assignment and path voltage bin assignment may be performed at either wafer test or module test.

FIG. 16 is a flowchart illustrating voltage bin assignment according to embodiments of the present invention. In step 625, frequencies of the ring oscillators in the macros of the selected Vt family are determined and averaged together in step 630 to obtain a PRSO frequency for the integrated circuit chip. For example, if the selected Vt family K was that of ring oscillators 505A of FIG. 11B and there were four PSRO macros (e.g., PSRO macros 124A, 124B, 124C and 124D of FIG. 1) the frequencies of the four ring oscillators 505 would be determined and averaged. In step 635, this average frequency is substituted for X in Table 565 (see FIG. 15) and the voltage bin that meets the Fmax range conditions is selected as the PSRO voltage bin.

Figure 17:
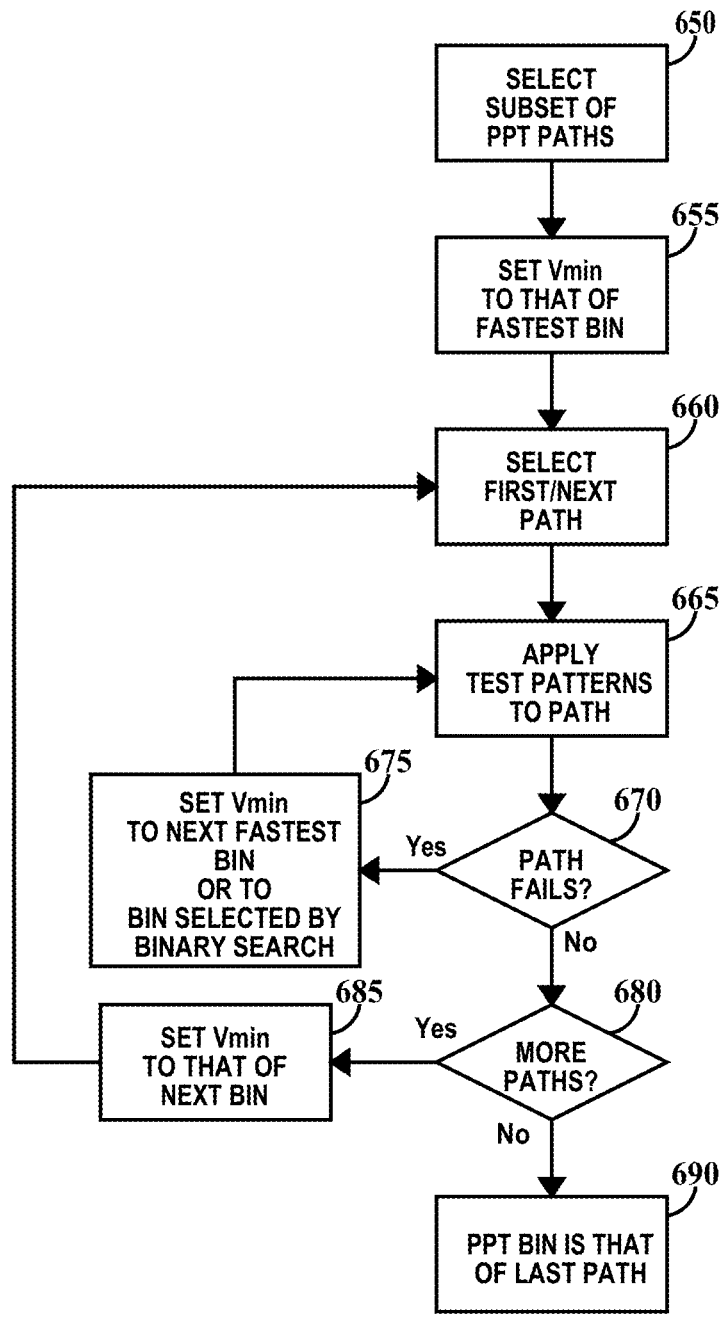
FIG. 17 is a flowchart of step 610 of the flowchart of FIG. 15 according to embodiments of the present invention.

FIG. 17 is a flowchart of step 610 of the flowchart of FIG. 15 according to embodiments of the present invention. In step 650 (i) a set of performance path testing data paths of FIGS. 8, 9 and 10 and corresponding test patterns and resultant test patterns or (ii) other functional data paths (i.e., data paths selected by a method other than the performance path testing methodology presented supra) and corresponding test patterns and resultant test patterns is selected. If the selected set of data paths is a subset of performance path testing data paths, it is preferred that the data paths be selected to cover as many different regions (see regions A1-A4, B1-B4, C1-C4 and D1-D4 of FIG. 2) of the integrated circuit chip as possible. If the selected set of data paths is a subset of functional data paths selected by other means, it is still preferred that the data paths be selected to cover as many different regions (see regions A1-A4, B1-B4, C1-C4 and D1-D4 of FIG. 2) of the integrated circuit chip as possible. In one example, about 20 performance path testing data paths (or functional data paths) is a suitable number of paths. In step 655, the Vmin (the value of VDD to be applied to the devices of the logic gates of the selected paths during pattern testing) is set to that of the fastest bin. Note this Vmin is the lowest allowed value of VDD. In the example of FIG. 13, this is bin 9. In the example of TABLE I this is bin 16. In step 660, the first/next path of the set of paths is selected. In step 665, test patterns are applied to the selected path and in step 670 it is determined if a resultant output pattern matches an expected pattern. If, in step 670, the resultant pattern does not an match an expected pattern then the path fails and the method proceeds to step 675. In step 675, Vmin is set to that of the next fastest bin (or to that of bin selected by a binary search algorithm and the method loops back to step 665 where the same path is tested again using the same test pattern. If, in step 670, the resultant pattern does match an expected pattern, then the path passes, and the method proceeds to step 680 unless there are bins between the last bin failed and the current passed bin at which the path has not been tested. In such a case the method proceeds to step 675 instead of step 680. This latter condition (there are bins between the last bin failed and the current passed bin at which the path has not been tested) only applies when a binary bin selection methodology is used. When a sequential bin selection methodology is used, there cannot be any bins between the last bin failed and the current passed bin at which the path has not been tested. If, in step 680, the last path tested is not the last path of the set of paths, then the method proceeds to step 685 where Vmin is set to that of the next slowest bin (or that of the next bin selected by the binary search algorithm) and the method loops back to step 660. If, in step 680, the last path tested is the last path of the set, then the method proceeds to step 690 where the performance path testing voltage bin (i.e., path voltage bin) is the bin of the last path.

FIG. 18A is a chart illustrating bin validation using path testing using a sequential bin selection methodology according to embodiments of the present invention. In FIG. 18A, an "F" means the path failed testing at the voltage of the corresponding voltage bin, a "P" means the path passed at the voltage of the corresponding voltage bin, and no entry means that the path was not tested at the voltage of the corresponding voltage bin. In FIG. 18A, path 1 has been tested at VDD from the Vmin value of bin 15 (the fastest bin) to the Vmin of bin 3. Bin 3 was the first time path 2 passed. Note a path will always pass bins to the right of the first bin the path passed. Paths 2 through 6 were tested at the Vmin of bin 3 and path 6 was the first path to fail. Path 7 was tested at the Vmin of bin 7 and failed but passed at the Vmin of bin 1. All other paths 9-16 passed at the Vmin of bin 1 so the bin of the integrated circuit chip is bin 1. Path 1 was tested 13 times, paths 6 and 7 tested 2 times each and all other paths tested once each for a total of 30 tests. Note after a path fails, the next voltage value chosen is the Vmin of a not previously selected bin.

FIG. 18B is a chart illustrating bin validation using path testing using a binomial bin selection methodology according to embodiments of the present invention. The same integrated circuit chip is tested in FIG. 18B as in FIG. 18A. In FIG. 18B, an "F" means the path failed testing at the voltage of the corresponding voltage bin, a "P" means the path passed at the voltage of the corresponding voltage bin, and no entry means that the path was not tested at the voltage of the corresponding voltage bin. In FIG. 18B, path 1 has been tested at the Vmin of bin 15 (the fastest bin) where it passed, tested again at the Vmin of bin 7 where it failed then tested at the Vmin of bin 0 where it passed and then tested at the Vmin of path 3 where it failed. Bin 3 was the not the first time path 1 passed, but the last time because the highest bin (lowest voltage) that a path passes must be found in a binary search. Path 7 was tested at the Vmin of bin 7 and failed but passed at the Vmin of bin 1. All other paths 9-16 passed at the Vmin of bin 1 so the bin of the integrated circuit chip is bin 1. Path 1 was tested 4 times, paths 6 and 7 tested 2 times each and all other paths tested once each for a total of 21 tests. Paths 2 through 6 were tested at the Vmin of bin 3 and path 6 was the first path to fail. Note after a path fails, the next voltage value chosen is the Vmin of a not previously selected bin.

Figure 19:
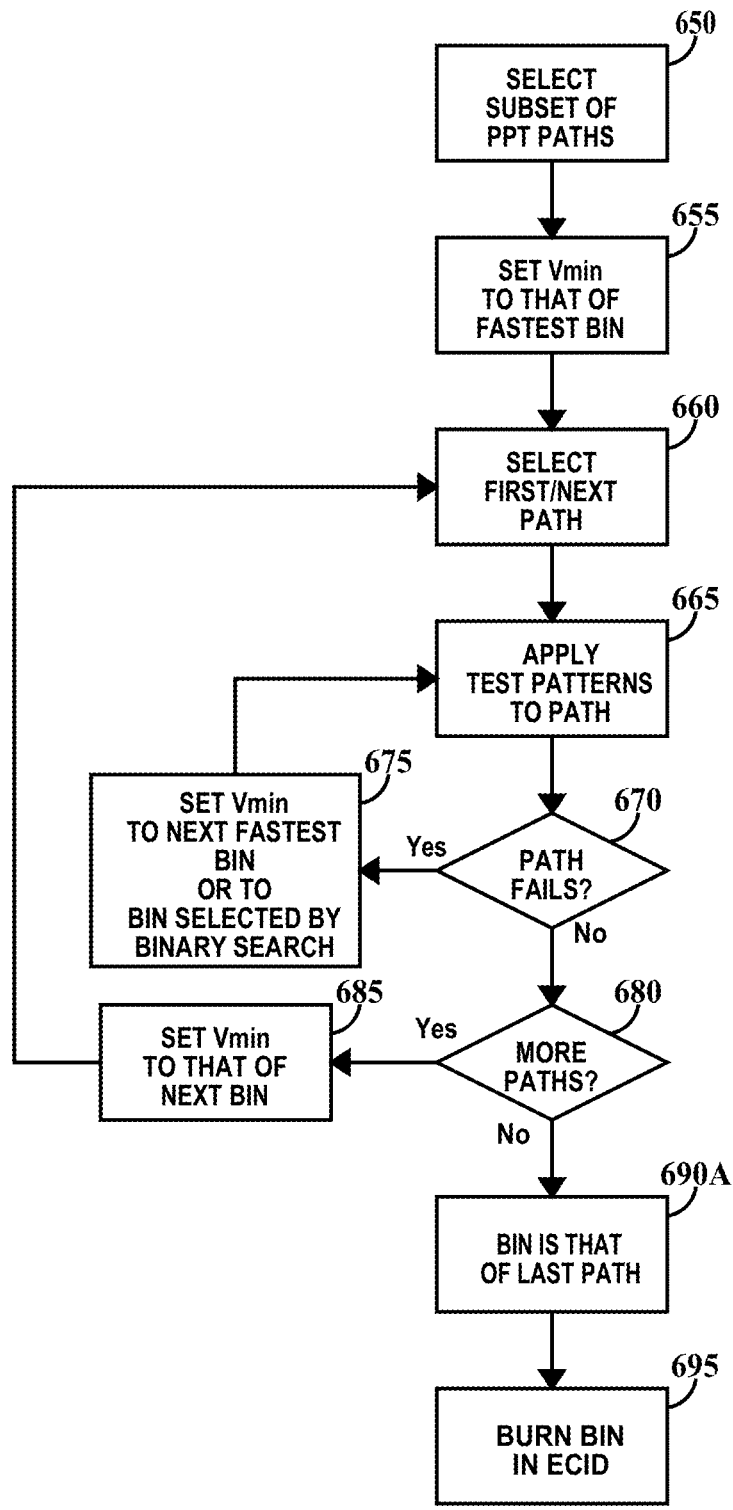
FIG. 19 illustrates bin assignment using path testing according to embodiments of the present invention.

FIG. 19 illustrates bin assignment using path testing according to embodiments of the present invention. The method illustrated in FIG. 17 may be utilized without performing a PRSO bin selection and be performed at wafer an/or module level. Steps 650 through 685 are the same as in FIG. 17. In step 690A, the voltage bin is the bin of the last path and in step 695 the bin is optionally burned into the exclusive chip ID (ECID) register of the integrated circuit chip.

Figure 20:
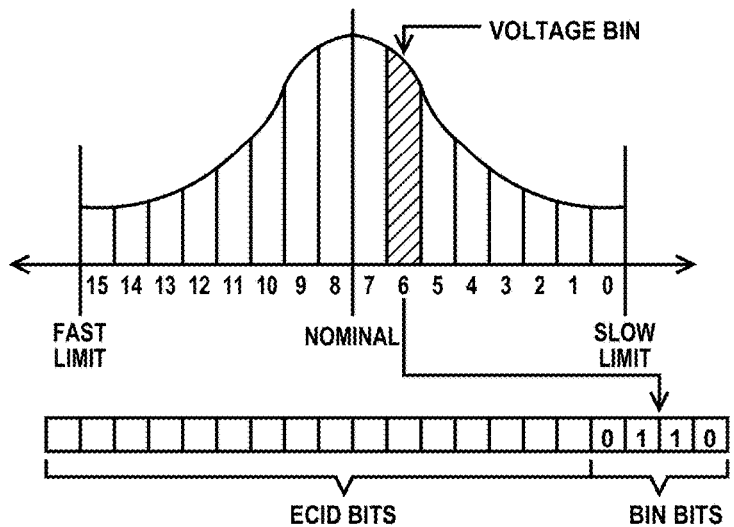
FIG. 20 illustrates the process of encoding an assigned bin on an integrated circuit chip according to embodiments of the present invention.

FIG. 20 illustrates the process of encoding an assigned bin on an integrated circuit chip according to embodiments of the present invention. In FIG. 20, an exemplary normal speed distribution of integrated circuits is sub-divided by voltage bin, with bin 6 highlighted. Integrated circuit chips having been found to fit voltage bin 6 would have the bits 0110 (6 in binary) burned into the 4 bit positions of the bin bits.

Figure 21:
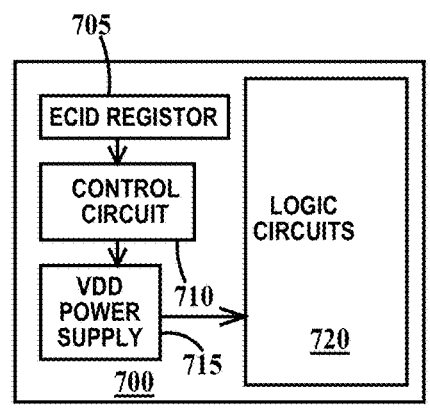
FIG. 21 is a diagram of an integrated circuit designed to utilize encoded bin assignment according to embodiments of the present invention.

FIG. 21 is a diagram of an integrated circuit designed to utilize encoded bin assignment according to embodiments of the present invention. In FIG. 21, integrated circuit chip 700 includes an ECID register 705 containing the ECID bits and bin bits of FIG. 20. ECID register 705 is connected to a control circuit 710 which is connected to a VDD power supply 715. Control circuit 710 decodes the bin bits and sets the output of VDD power supply 715 to the Vmin of the encoded bin (in the example of FIG. 20, this is bin 6). VDD power supply 710 then supplies this VDD to logic circuits 720 which will run at a frequency and power level associated with that bin.

Figure 22:
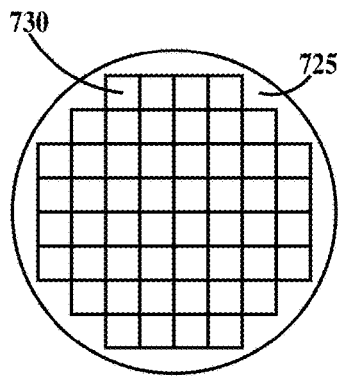
FIG. 22 illustrates in top view un-singulated integrated circuit chips on a wafer.

FIG. 22 illustrates, in top view, un-singulated integrated circuit chips on a wafer. In FIG. 22, a semiconductor wafer 725 includes multiple integrated circuit chips 730 formed on the wafer. Testing an integrated circuit chip while the integrated circuit chips are un-singulated is defined as wafer level testing. During singulation (i.e., dicing) the wafer is cut horizontally and vertically between the columns and rows of chips and the individual chips collected.

Figure 23:
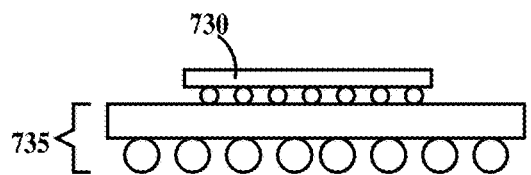
FIG. 23 illustrates in side view an integrated circuit chip mounted on a module.

FIG. 23 illustrates in side view an integrated circuit chip mounted on a module. In FIG. 23, by way of example, an integrated circuit 730 has been flip-chip mounted on a ball grid array module 735. Testing an integrated circuit chip after mounting on a module is defined as module level testing.

Generally, the method described herein with respect to methods for selecting critical paths for performance testing integrated circuit chips is practiced with a general-purpose computer and the methods described supra in the flow diagrams of FIGS. 6, 7, 8, 9 and 10 may be coded as a set of instructions on removable or hard media for use by the general-purpose computer.

Generally, the method described herein with respect to a method for disposition of integrated circuits is practiced with test systems that include a computer linked to or included in the test system and the methods described supra in the flow diagrams FIGS. 14, 15, 16, 17 and 19 may be coded as a set of instructions on removable or hard media for use by the computer.

Figure 24:
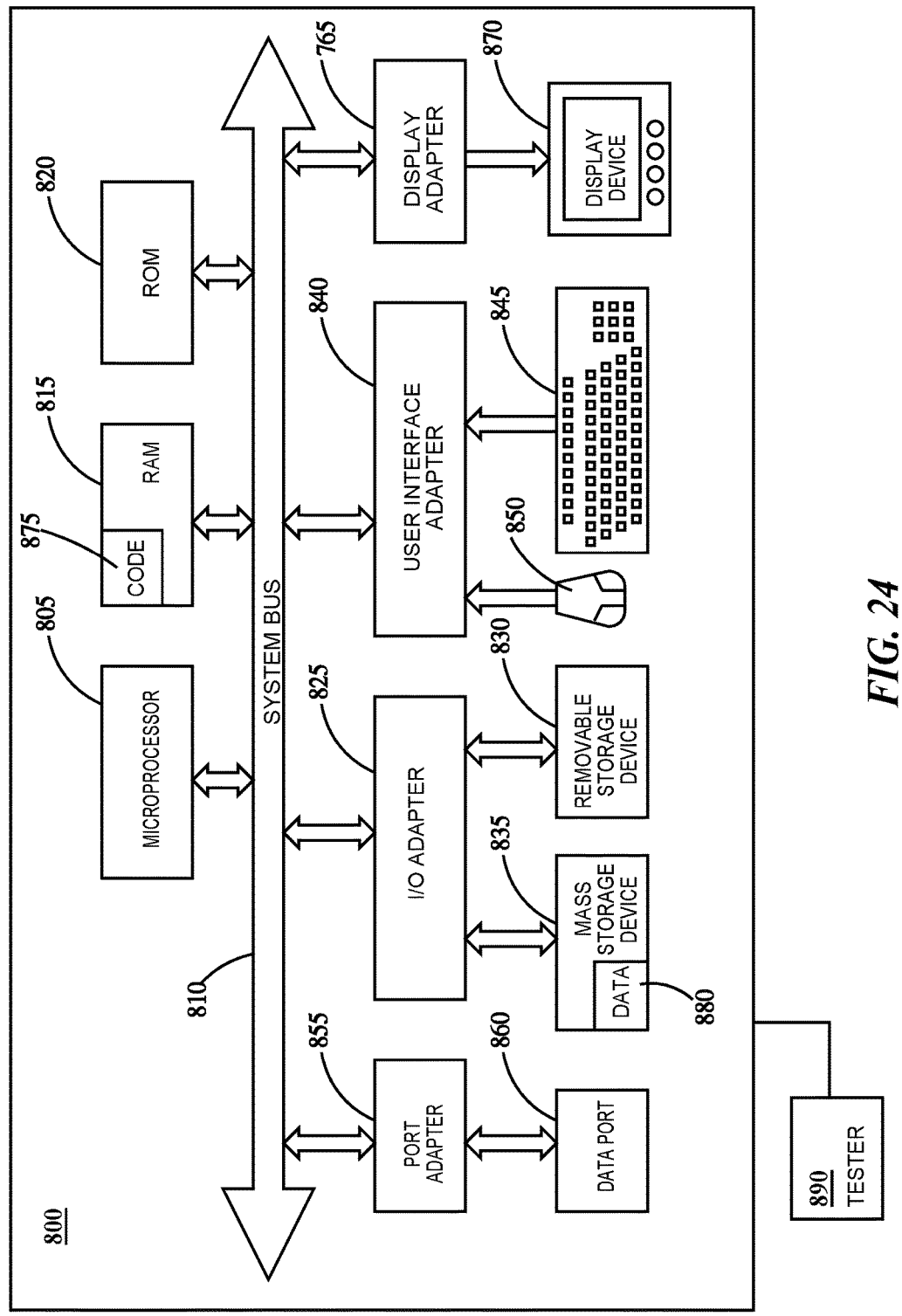
FIG. 24 is a schematic block diagram of a general-purpose computer that may be used in practicing embodiments of the present invention.

FIG. 24 is a schematic block diagram of a general-purpose computer that may be used in practicing embodiments of the present invention. In FIG. 24, computer system 800 has at least one microprocessor or central processing unit (CPU) 805. CPU 805 is interconnected via a system bus 810 to a random access memory (RAM) 815, a read-only memory (ROM) 820, an input/output (I/O) adapter 825 for connecting a removable data and/or program storage device 830 and a mass data and/or program storage device 835, a user interface adapter 840 for connecting a keyboard 845 and a mouse 850, a port adapter 855 for connecting a data port 860 and a display adapter 865 for connecting a display device 870. RAM 815 includes code 875 and mass storage device 835 includes data 880 A tester 890 is attached to computer system 800 is well known in the art.

ROM 820 contains the basic operating system for computer system 800. The operating system may alternatively reside in RAM 815 or elsewhere as is known in the art. Examples of removable data and/or program storage device 830 include magnetic media such as floppy drives and tape drives and optical media such as CD ROM drives. Examples of mass data and/or program storage device 835 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 845 and mouse 850, other user input devices such as trackballs, writing tablets, pressure pads, microphones, light pens and position-sensing screen displays may be connected to user interface 840. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for the computer program created to run the present invention is loaded on the appropriate removable data and/or program storage device 830, fed through data port 860 or typed in using keyboard 845.

Thus, the embodiments of the present invention provide methods of validating and assigning performance bins to integrated circuit chips using path testing that require more accurately represents the true power to performance ratio of the integrated circuit chip.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) selecting a voltage bin of a set of voltage bins, each voltage bin having a different range of frequencies based on the highest operating frequency and the lowest operating frequency specified for an integrated circuit chip and setting a voltage supply of said integrated circuit chip to an initial supply voltage value associated with said selected voltage bin and setting a current supply voltage value to said initial supply voltage value;
   (b) selecting a path of a set of testable data paths of said integrated circuit chip not previously tested;
   (c) performing a functional path test on said selected path, said functional path test based on applying test patterns to said selected path at said current supply voltage value;
   (d) if said integrated circuit chip fails said functional path test, then changing said current supply voltage value to a voltage value associated with a not previously selected voltage bin;
   (e) selecting a not previously tested path of said set of testable paths, wherein said set of voltages bins sequentially increment from a bin with a lowest voltage supply value associated with a highest frequency range specification to a bin with a highest voltage supply value associated with a lowest frequency range specification and wherein said not previously selected voltage bin is a next highest voltage bin, and repeating (c) and (e) until every path of said set of testable paths has been tested; and
   (f) setting a path voltage bin for the integrated circuit chip to a voltage bin of said set of voltage bins corresponding to said current supply voltage value.

2. The method of claim 1, wherein said not previously selected voltage bin is selected based on a binary selection algorithm.

3. The method of claim 1, including:
   writing a code representing said path voltage bin into an exclusive chip ID register of said integrated circuit chip.

4. The method of claim 1, including:
   performing said functional path test on said integrated when said integrated circuit chip is mounted on a module.

5. The method of claim 1, including:
   before (a), performing a performance sort ring oscillator test on ring oscillators of said integrated circuit chip and selecting a ring oscillator voltage bin from said set of voltage bins based on comparing frequencies of said ring oscillators obtained from said performance sort ring oscillator test to frequency ranges associated with each voltage bin of said set of voltage bins; and
   after (e), if said ring oscillator voltage bin matches said path voltage bin setting a speed sort voltage bin of said integrated circuit chip to said ring oscillator voltage bin or if said ring oscillator voltage bin does not matches said path voltage bin setting said speed sort voltage bin of said integrated circuit chip to said path voltage bin.

6. The method of claim 5, wherein said integrated circuit chip includes at least one set of ring oscillators and wherein said performance sort ring oscillator test includes:
   for each ring oscillator determining an output frequency;
   determining an average output frequency of every ring oscillator of every set of ring oscillators; and
   said selecting a ring oscillator voltage bin from said set of voltage bins is based on said average output frequency of every ring oscillator of every set of ring oscillator.

7. The method of claim 5, wherein said integrated circuit chip is un-singulated on a wafer during said performance sort ring oscillator test and said integrated circuit chip is mounted on a module during said functional path test.

8. The method of claim 1, including:
   determining, by simulating a design of said integrated circuit chip, an upper frequency specification limit and a lower frequency specification limit of said integrated circuit chip;
   subtracting said lower frequency specification limit from said upper specification limit to obtain a frequency range and partitioning said frequency range into said set of frequency bins; and
   assigning a voltage value to each of said frequency bins.

9. The method of claim 1, wherein said integrated circuit chip includes at least one clock domain and said testable data paths include data paths from every clock domains of said integrated circuit chip.

10. The method of claim 1, wherein said testable data paths include data paths selected from different regions of said integrated circuit chip that include at least a portion of one clock domain.

11. The method of claim 1, wherein said set of testable paths is less than every testable paths of said integrated circuit chip.

12. The method of claim 1, including:
   generating said testable data paths, said generating said testable data paths including:
      identifying clock domains having multiple data paths of a design of said integrated circuit chip, said design having multiple clock domains;
      selecting, from said data paths, critical paths for each clock domain of the multiple clock domains;
      using a computer, for each clock domain of said multiple clock domains, selecting the testable paths of said critical paths;
      for each clock domain of said multiple clock domain, selecting test paths from the testable critical paths; and
      creating a test program to perform said functional path test.

13. A test system including a tester connected to a computer system comprising a processor, a memory coupled to the processor, and a computer readable storage device coupled to the processor, said storage device containing program code configured to be executed by the processor to implement a method for voltage binning electronic devices, said method comprising:
   (a) selecting a voltage bin of a set of voltage bins, each voltage bin having a different range of frequencies based on the highest operating frequency and the lowest operating frequency specified for an integrated circuit chip and setting a voltage supply of said integrated circuit chip to an initial supply voltage value associated with said selected voltage bin and setting a current supply voltage value to said initial supply voltage value;
   (b) selecting a path of a set of testable data paths of said integrated circuit chip not previously tested;
   (c) performing a functional path test on said selected path, said functional path test based on applying test patterns to said selected path at said current supply voltage value;
   (d) if said integrated circuit chip fails said functional path test, then changing said current supply voltage value to a voltage value associated with a not previously selected voltage bin;
   (e) selecting a not previously tested path of said set of testable paths, wherein said set of voltages bins sequentially increment from a bin with a lowest voltage supply value associated with a highest frequency range specification to a bin with a highest voltage supply value associated with a lowest frequency range specification and wherein said not previously selected voltage bin is a next highest voltage bin, and repeating (c) and (e) until every path of said set of testable paths has been tested; and
   (f) setting a path voltage bin for the integrated circuit chip to a voltage bin of said set of voltage bins corresponding to said current supply voltage value.

14. The test system of claim 13, wherein, in said method, said not previously selected voltage bin is selected based on a binary selection algorithm.

15. The test system of claim 13, the method including:
   writing a code representing said path voltage bin into an exclusive chip ID register of said integrated circuit chip.

16. The test system of claim 13, the method including:
   before (a), performing a performance sort ring oscillator test on ring oscillators of said integrated circuit chip and selecting a ring oscillator voltage bin from said set of voltage bins based on comparing frequencies of said ring oscillators obtained from said performance sort ring oscillator test to frequency ranges associated with each voltage bin of said set of voltage bins; and
   after (e), if said ring oscillator voltage bin matches said path voltage bin setting a speed sort voltage bin of said integrated circuit chip to said ring oscillator voltage bin or if said ring oscillator voltage bin does not matches said path voltage bin setting said speed sort voltage bin of said integrated circuit chip to said path voltage bin.

17. The test system of claim 16, the method including:
   measuring an output frequency of at least one ring oscillator;
   determining an average output frequency said at least two ring oscillators; and
   said selecting a ring oscillator voltage bin from said set of voltage bins is based on said average output frequency of every ring oscillator of every set of ring oscillator.

18. The test system of claim 13, wherein, in said method, testable data paths from every clock domain of said integrated circuit chip are tested.

19. The test system of claim 13, wherein, in said method, testable data paths from different regions of said integrated circuit chip that include at least a portion of one clock domain are tested.

20. The test system of claim 13, wherein, in said method, less than every testable path of said integrated circuit chip are tested.

21. A computer program product for voltage binning electronic devices, the computer program product comprising:
   a non-transitory computer readable storage device having computer readable program code embodied therewith, the computer readable program code comprising:
   computer readable program code configured to perform a method comprising:
   (a) selecting a voltage bin of a set of voltage bins, each voltage bin having a different range of frequencies based on the highest operating frequency and the lowest operating frequency specified for an integrated circuit chip and setting a voltage supply of said integrated circuit chip to an initial supply voltage value associated with said selected voltage bin and setting a current supply voltage value to said initial supply voltage value;
   (b) selecting a path of a set of testable data paths of said integrated circuit chip not previously tested;

(c) performing a functional path test on said selected path, said functional path test based on applying test patterns to said selected path at said current supply voltage value;

(d) if said integrated circuit chip fails said functional path test, then changing said current supply voltage value to a voltage value associated with a not previously selected voltage bin;

(e) selecting a not previously tested path of said set of testable paths, wherein said set of voltages bins sequentially increment from a bin with a lowest voltage supply value associated with a highest frequency range specification to a bin with a highest voltage supply value associated with a lowest frequency range specification and wherein said not previously selected voltage bin is a next highest voltage bin, and repeating (c) and (e) until every path of said set of testable paths has been tested; and (f) setting a path voltage bin for the integrated circuit chip to a voltage bin of said set of voltage bins corresponding to said current supply voltage value.

22. The computer program product of claim 21, wherein, in said method, said not previously selected voltage bin is selected based on a binary selection algorithm.

* * * * *